(12) United States Patent
Hsu et al.

(10) Patent No.: US 9,263,445 B2
(45) Date of Patent: Feb. 16, 2016

(54) METHOD OF FABRICATING DUAL HIGH-K METAL GATES FOR MOS DEVICES

(71) Applicant: Taiwan Semiconductor Manufacturing Company, Ltd., Hsin-Chu (TW)

(72) Inventors: Peng-Fu Hsu, Hsinchu (TW); Kang-Cheng Lin, Hsinchu (TW); Kuo-Tai Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/507,362

(22) Filed: Oct. 6, 2014

(65) Prior Publication Data

US 2015/0021705 A1 Jan. 22, 2015

Related U.S. Application Data

(62) Division of application No. 13/329,877, filed on Dec. 19, 2011, now Pat. No. 8,853,068, which is a division of application No. 12/424,739, filed on Apr. 16, 2009, now Pat. No. 8,105,931.

(60) Provisional application No. 61/092,315, filed on Aug. 27, 2008.

(51) Int. Cl.

| *H01L 29/78* | (2006.01) |
| *H01L 29/51* | (2006.01) |
| *H01L 27/092* | (2006.01) |
| *H01L 21/8238* | (2006.01) |
| *H01L 29/49* | (2006.01) |

(52) U.S. Cl.
CPC ...... *H01L 27/092* (2013.01); *H01L 21/823842* (2013.01); *H01L 29/49* (2013.01); *H01L 29/51* (2013.01)

(58) Field of Classification Search
CPC . H01L 29/495; H01L 29/665; H01L 29/4933; H01L 29/76; H01L 29/66; H01L 29/94; H01L 29/49; H01L 29/51; H01L 29/78; H01L 27/092
USPC ......... 257/369, 202, 295, 310, 288, 296, 388, 257/406, 407, 330, 331, 332
See application file for complete search history.

(56) References Cited

U.S. PATENT DOCUMENTS

| 5,496,752 A | 3/1996 | Nasu et al. |
| 6,468,851 B1 | 10/2002 | Ang et al. |
| 6,653,698 B2 | 11/2003 | Lee et al. |
| 6,794,281 B2 | 9/2004 | Madhukar et al. |
| 7,005,365 B2 | 2/2006 | Chambers |

(Continued)

*Primary Examiner* — Chuong A Luu
(74) *Attorney, Agent, or Firm* — Haynes and Boone, LLP

(57) ABSTRACT

The present disclosure provides a method of fabricating a semiconductor device. The method includes providing a semiconductor substrate having a first region and a second region, forming a high-k dielectric layer over the semiconductor substrate, forming a capping layer over the high-k dielectric layer in the first region, forming a first metal layer over capping layer in the first region and over the high-k dielectric in the second region, thereafter, forming a first gate stack in the first region and a second gate stack in the second region, protecting the first metal layer in the first gate stack while performing a treatment process on the first metal layer in the second gate stack, and forming a second metal layer over the first metal layer in the first gate stack and over the treated first metal layer in the second gate stack.

20 Claims, 14 Drawing Sheets

(56) References Cited

U.S. PATENT DOCUMENTS

| | | |
|---|---|---|
| 7,229,873 B2 | 6/2007 | Colombo et al. |
| 7,378,713 B2 | 5/2008 | Hsu et al. |
| 7,902,599 B2 | 3/2011 | Carter et al. |
| 8,105,931 B2 | 1/2012 | Hsu et al. |
| 8,536,660 B2 | 9/2013 | Hsu et al. |
| 2007/0148838 A1* | 6/2007 | Doris et al. .................. 438/197 |
| 2009/0230479 A1* | 9/2009 | Hsu et al. .................... 257/369 |
| 2012/0086085 A1 | 4/2012 | Hsu et al. |

* cited by examiner

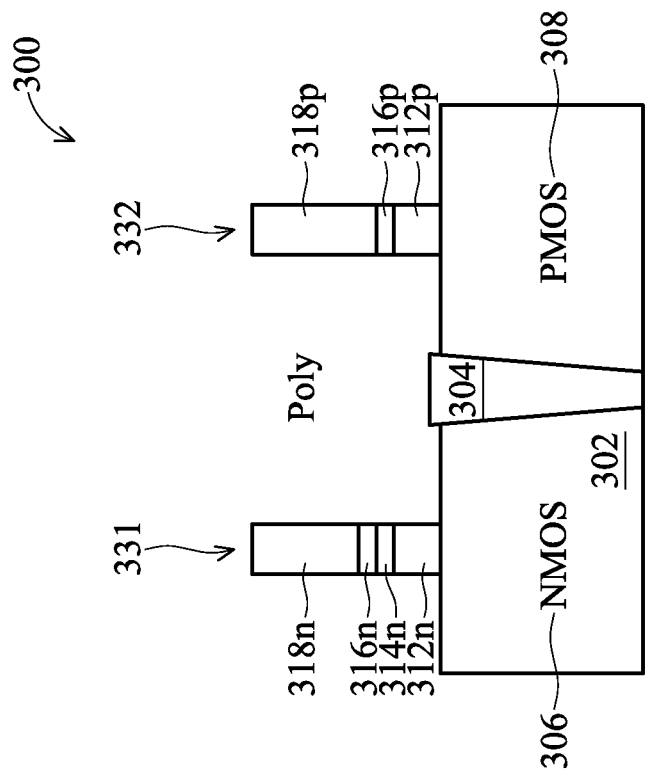
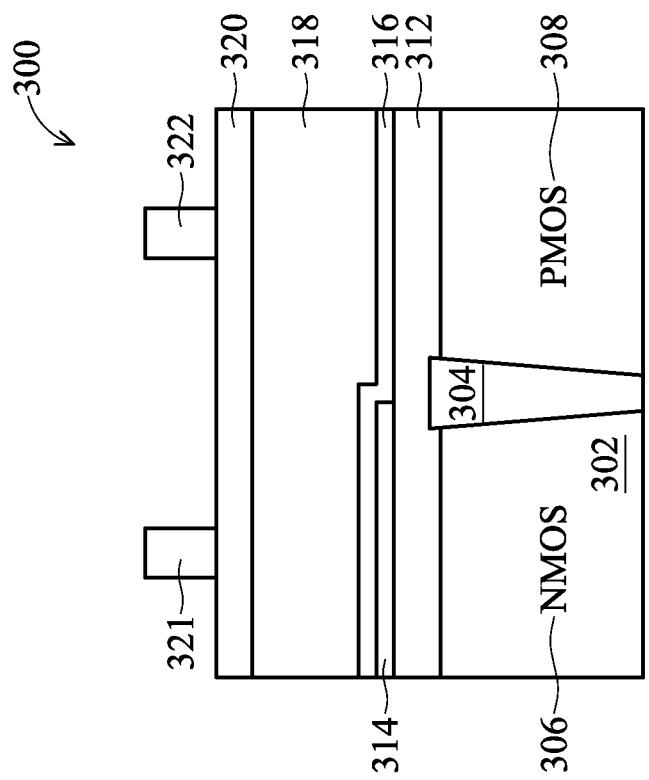

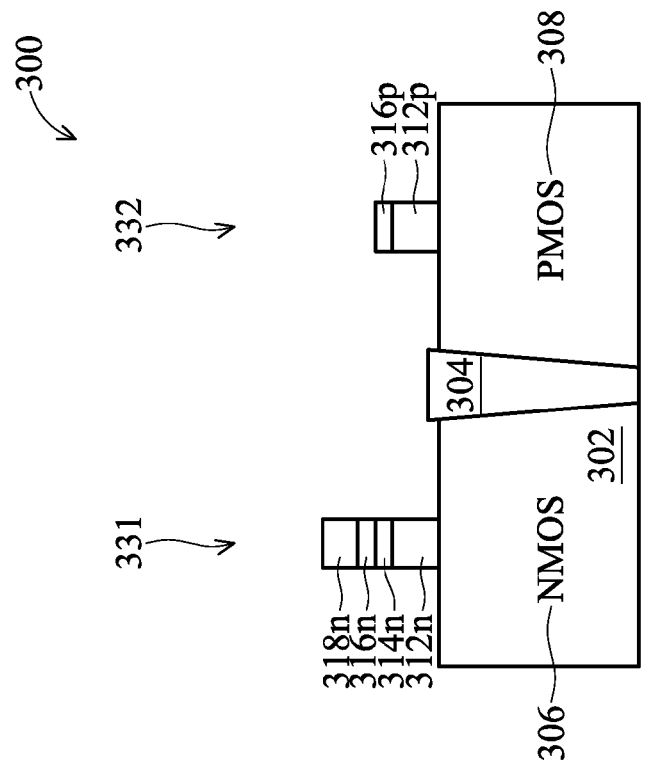
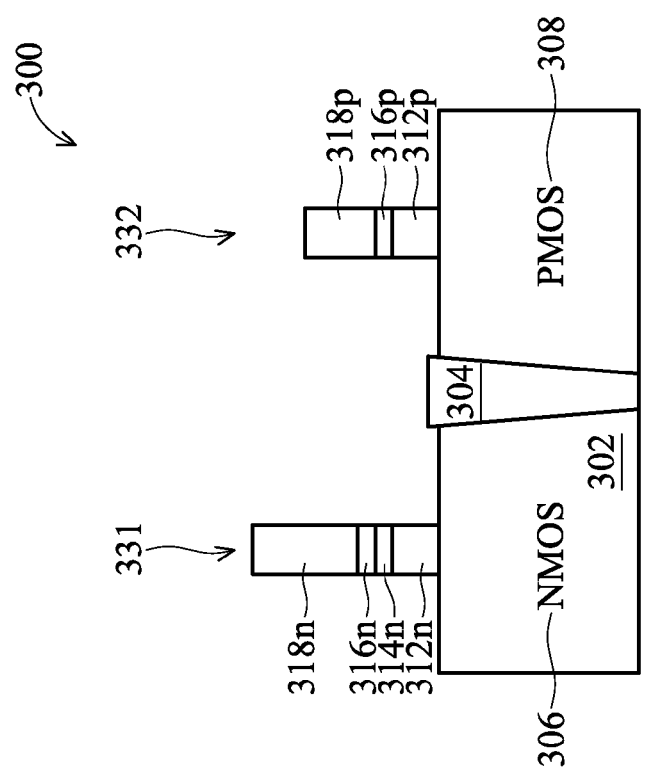

METHOD OF FABRICATING DUAL HIGH-K METAL GATES FOR MOS DEVICES

PRIORITY DATA

This application is a divisional application of U.S. patent application Ser. No. 13/329,877, filed on Dec. 19, 2011 now U.S. Pat. No. 8,853,068, which is a divisional of application of U.S. patent application Ser. No. 12/424,739, filed on Apr. 16, 2009, now U.S. Pat. No. 8,105,931, which claims priority to Provisional Application Ser. No. 61/092,315 filed on Aug. 27, 2008, entitled "METHOD OF FABRICATING DUAL HIGH-K METLA GATES FOR MOS DEVICES," each of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, an n-type MOS device (NMOS) and a p-type MOS device (PMOS) require different work functions for their respective gate structures.

SUMMARY

One of the broader forms of an embodiment of the invention involves a method for fabricating a semiconductor device. The method includes providing a semiconductor substrate having a first region and a second region, forming a high-k dielectric layer over the semiconductor substrate, forming a capping layer over the high-k dielectric layer in the first region, forming a first metal layer over capping layer in the first region and over the high-k dielectric in the second region, thereafter, forming a first gate stack in the first region and a second gate stack in the second region, protecting the first metal layer in the first gate stack while performing a treatment process on the first metal layer in the second gate stack, and forming a second metal layer over the first metal layer in the first gate stack and over the treated first metal layer in the second gate stack.

Another one of the broader forms of an embodiment of the invention involves a semiconductor device. The semiconductor device includes a semiconductor substrate, first and second transistors formed in the semiconductor substrate. The first transistor has a gate structure that includes a high-k dielectric formed over the substrate, a capping layer formed over the high-k dielectric, an untreated first metal layer formed over the capping layer, and a second metal layer formed over the untreated first metal layer. The second transistor has a gate structure that includes the high-k dielectric formed over the substrate, a treated first metal layer formed over the high-k dielectric, and the second metal layer formed over the treated first metal layer.

Yet another one of the broader forms of an embodiment of the invention involves a method for fabricating a semiconductor device. The method includes providing a semiconductor substrate having a first region and a second region, forming a high-k dielectric layer over the semiconductor substrate, forming a capping layer over the high-k dielectric layer in the first region, forming a first metal layer over capping layer in the first region and over the high-k dielectric layer in the second region, the first metal having a first work function, thereafter, forming a first gate stack in the first region and a second gate stack in the second region, forming a second metal over the first metal in the second gate stack, the second metal having a second work function, and forming a third metal layer over the first metal layer in the first gate stack and over the second metal layer in the second gate stack.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2I are cross-sectional views of a semiconductor device at various stages of fabrication according to the method of FIG. 1;

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
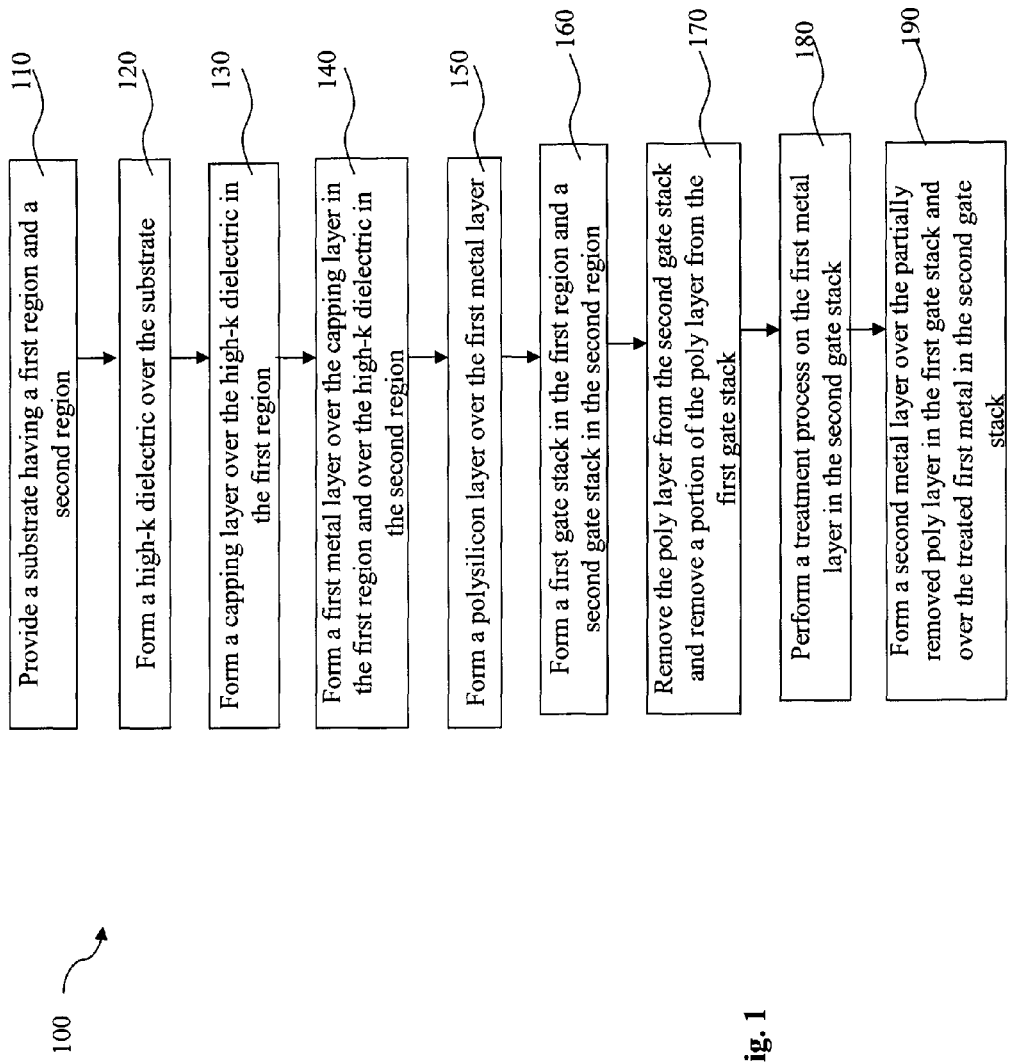
FIG. 1 is a flowchart illustrating a method for fabricating a semiconductor device having a dual metal gate structure according to various aspects of the present disclosure.

Referring to FIG. 1, illustrated is a flowchart of a method 100 for fabricating a semiconductor device having a dual metal gate structure according to various aspects of the present disclosure. Referring also to FIGS. 2A to 2I, illustrated are cross-sectional views of a semiconductor device 300 at various stages of fabrication according to the method 100 of FIG. 1. FIGS. 2A to 2I have been simplified to emphasize the formation of a dual metal gate structure of an NMOS device and PMOS device, respectively, and for a better understanding of the inventive concepts of the present disclosure. For example, the semiconductor 300 may include various features (but are not illustrated) such lightly doped drain (LDD) regions, sidewall spacers, source/drain (S/D) regions, silicide regions, contact etch stop layer (CESL), and other suitable features. Further, it is understood that part of the semiconductor device 300 may be fabricated with a normal CMOS process flow, and thus some processes are only briefly described herein.

The semiconductor device 300 may be fabricated in a hybrid process including a gate first process and a gate last process. In the gate first process, a metal gate structure may be formed first and may be followed by CMOS process flow to fabricate the final device. In the gate last process, a dummy poly gate structure may be formed first and may be followed normal CMOS process flow until deposition of an interlayer dielectric (ILD), and then the dummy poly gate structure may be removed and replaced with a metal gate structure. In the hybrid gate process, a metal gate structure of one type of device may be formed first and a metal gate structure of another type of device may be formed last as discussed below. For example, the N-metal for an NMOS device may be formed first and the P-metal for a PMOS device may be formed last.

Figure 2A:
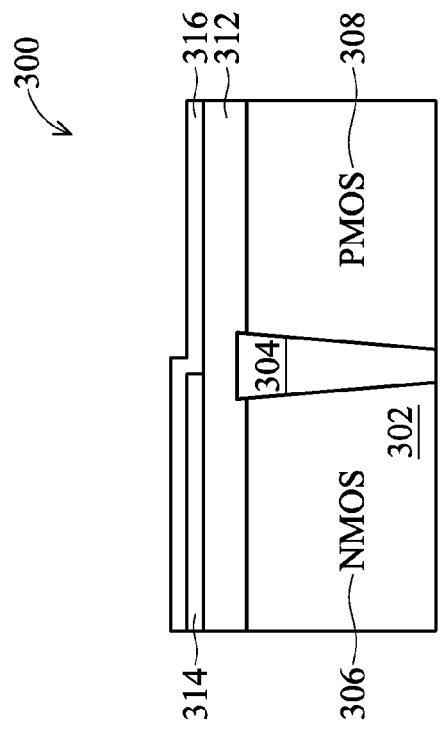

The method 100 begins with block 110 in which a semiconductor substrate may be provided, the substrate having a first region and a second region. In FIG. 2A, the semiconductor device 300 may include a semiconductor substrate 302 such as a silicon substrate. The substrate 302 may alternatively include silicon germanium, gallium arsenic, or other suitable semiconductor materials. The substrate 302 may further include other features such as various doped regions such as p-wells or n-wells, a buried layer, and/or an epitaxy layer. Furthermore, the substrate 302 may be a semiconductor on insulator such as silicon on insulator (SOI). In other embodiments, the semiconductor substrate 302 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 300 may further include an isolation structure 304 such as a shallow trench isolation (STI) feature formed in the substrate 302 for isolating active regions 306 and 308 in the substrate. The isolation structure may be formed of silicon oxide, silicon nitride, silicon oxynitride, fluoride-doped silicate (FSG), and/or a low k dielectric material known in the art. The active region 306 may be configured as an NMOS device and the active region 308 may be configured as a PMOS device.

The semiconductor device 300 may further include an interfacial layer or IL (not shown) formed over the substrate 302. The interfacial layer may include a silicon oxide layer (e.g., thermal or chemical oxide) having a thickness ranging from about 5 to about 10 angstrom (A). The method 100 continues with block 120 in which a high-k dielectric layer may be formed over the substrate. The semiconductor device 300 may further include a high-k dielectric layer 312 formed on the interfacial layer. The high-k dielectric layer 312 may be formed by atomic layer deposition (ALD) or other suitable technique. The high-k dielectric layer 312 may include a thickness ranging from about 10 to about 30 angstrom (A).

The high-k dielectric layer 312 may include hafnium oxide ($HfO_2$). Alternatively, the high-k dielectric layer 312 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The method 100 continues with block 130 in which a capping layer may be formed over the high-k dielectric layer in the first region. The semiconductor device 300 may further include a capping layer for tuning a work function of the metal layer for properly performing as an NMOS transistor device 306 or a PMOS transistor device 308. For example, a capping layer 314 such as lanthanum oxide ($LaO_x$) may be formed in the NMOS device 306. The capping layer 314 may include a thickness ranging from about 3 to about 20 angstrom (A). The capping layer 314 may be formed by depositing a capping layer over the substrate 302 and patterning (using a photoresist) the capping layer to remove the capping layer from the PMOS device 308. It should be noted that the capping layer 314 includes a high thermal budget to withstand subsequent processing. Alternatively, a capping layer (not shown) such as aluminum oxide ($Al_2O_3$) may optionally be formed in the PMOS region 308 under the high-k dielectric layer.

Figure 2B:
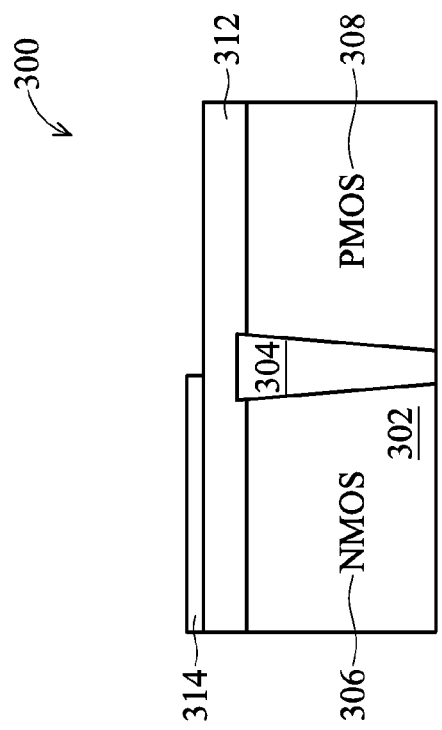

The method 100 continues with block 140 in which a first metal layer may be formed over the capping layer in the first region and over the high-k dielectric layer in the second region. In FIG. 2B, the semiconductor device 300 may further include a metal layer 316 formed over the capping layer 314 in the NMOS device 306 and over the high-k dielectric layer 312 in the PMOS device. The metal layer 316 may include an N-type work function metal (N-type metal). For example, the metal layer 316 may include TiN having a thickness ranging from about 10 to about 200 angstrom (A). The metal layer 316 may be formed by various deposition techniques such as chemical vapor deposition (CVD), physical vapor deposition (PVD or sputtering), plating, or other suitable technique. Alternatively, the metal layer 316 may optionally include TaC, TaN, or other suitable metals.

The method 100 continues with block 150 in which a polysilicon layer may be formed over the first metal layer. In FIG. 2C, the semiconductor device 300 may further include a polysilicon (or poly) layer 318 formed over the N-type metal layer 316 by a suitable deposition process. The poly layer 318 may include a thickness ranging from about 400 to about 800 angstrom (A). It should be noted that the metal layer 316 may help eliminate a Fermi level pinning (FLP) between the poly layer 318 and the high-k dielectric 312 during subsequent processing. The semiconductor device 300 may further include a hard mask layer 320, such as silicon nitride or silicon oxynitride, formed on the poly layer 318. The hard mask layer 320 may include a thickness ranging from about 100 to about 400 angstrom (A). Further, the semiconductor device 300 may include an antireflective coating layer or bottom antireflective coating (BARC) layer to enhance a photolithography process for patterning a photoresist layer. For example, a patterned photoresist layer may be formed on the hard mask layer 320 including a pattern 321 overlying the NMOS device 306 and a pattern 322 overlying the PMOS device 308. The patterns 321, 322 may be used to pattern the hard mask layer 320 by a dry or wet etch process.

The method 100 continues with block 160 in which a first gate stack may be formed in the first region and a second gate stack may be formed in the second region. In FIG. 2D, the patterned hard mask may be used to form a gate stack 331 in the NMOS device 306 and a gate stack 332 in the PMOS device 308 by a dry etch, wet etch, or combination dry and wet etch process. The gate stack 331 may include a high-k dielectric 312n, a capping layer 314n, an N-metal layer 316n, and a poly layer 318n. The gate stack 332 may include an interfacial layer a high-k dielectric 312p, an N-metal layer 316p, and a poly layer 318p. It is understood the semiconductor device 300 may continue with CMOS process flow to form various structures such as lightly doped drain regions (LDD), sidewall spacers on the gate stacks, source/drain regions, etc. until deposition of an interlayer dielectric (ILD). Thereafter, a CMP process or may be performed in the gate last process to expose the poly layers 318n, 318p of the gate stacks 331, 332, respectively. Alternatively, the poly layer 318n, 318p may be exposed by an etch back process.

The method 100 continues with block 170 in which the poly layer may be removed from the second gate stack and a portion of the poly layer may be removed from the first gate stack. In FIG. 2E, an N/P patterning process may be performed to partially remove the poly layer 318p and in the PMOS device 308. For example, the N/P photolithography patterning process (PMOS N/P patterning) may be performed to protect the NMOS device 306 with a photoresist. The photolithography process may include spin coating, soft-baking, exposure, post-baking, developing, rinsing, drying, and other suitable process. Alternatively, the N/P patterning may be performed by immersion lithography, electron beam lithography, or other suitable process. The poly layer 318p in the PMOS device 308 may be partially removed by a dry etch process or other suitable process. Following the partial removal of the poly layer 318p in the PMOS device 308, the photoresist (not shown) may be removed or stripped with ash process.

In FIG. 2F, the remaining portion of the poly layer 318p in the PMOS device 308 and a portion of the poly layer 318n in the NMOS device 306 may both be removed by a wet etch process. The wet etch process may have a high selectivity such that the process may stop at the N-metal layer 316p in the PMOS device 308. It should be noted that the N-metal layer 316p in the PMOS device 308 may be used an etch barrier. Accordingly, the portion of the poly layer 338n in the NMOS device 306 may remain on the N-metal layer 316n. It should be noted that the process discussed with reference to FIGS. 2E and 2F may be alternatively performed by completely removing the poly layer 318p in the PMOS device 308 side instead of partially removing the poly layer 318p, and then performing a dry or wet etch process that selectively removes a portion of the poly layer 318n in the NMOS device 306 side.

Figure 2H:
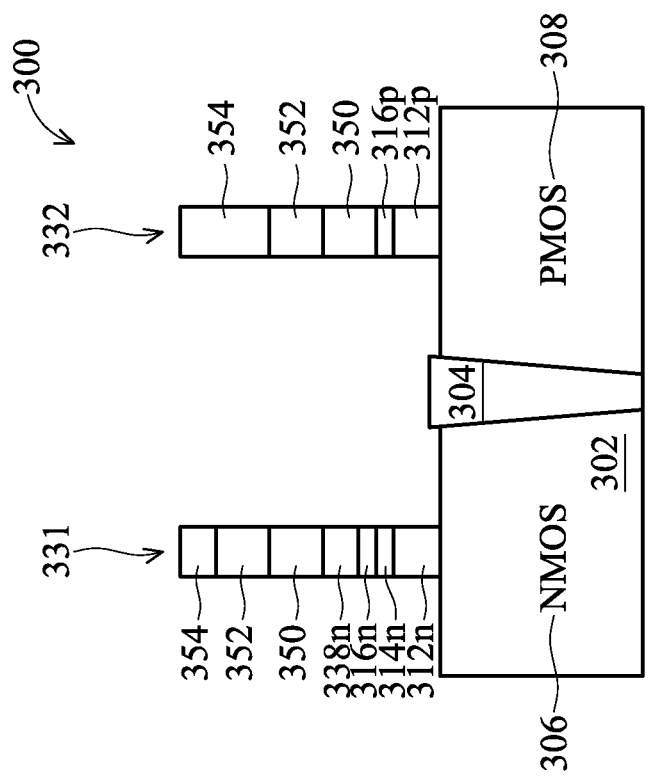
Figure 2G:
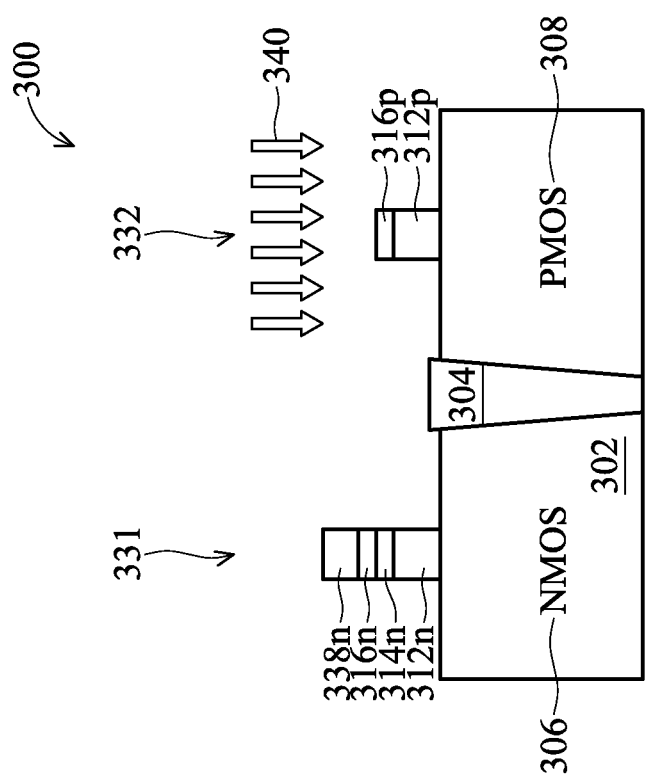

The method 100 continues with block 180 in which a treatment process may be performed on the first metal layer in the second device. In FIG. 2G, the treatment process 340 may be performed on the N-metal layer 316p in the PMOS device 308. The remaining portion of the poly layer 338n in the NMOS device 306 may protect the underlying N-metal layer 316n from the treatment process 340. The treatment process 340 may include an $O_2$ annealing process or plasma treatment process. The annealing process may be conducted with a temperature less than about 500 degree C. and at high pressure ranging from 2 to about 10 atm. The temperature is set so as not to damage other structures of the semiconductor device such as the silicide features. Further, the plasma treatment process may include a flow of $CF_4$ or $SF_6$ in room temperature. The treatment process 340 on the N-metal layer 316p in the PMOS device 308 may modulate the work function of the metal layer 316p into a P work function metal (e.g., PMOS Vt/Work Function Engineering).

The method 100 continues with block 190 in which a second metal layer may deposited over the partially removed poly layer in the first region and over the treated first metal layer in the second region. In FIG. 2H, various metal layers may be deposited to form the P-metal in the PMOS device 308, and to complete the gate structures. For example, a metal layer 350 may be formed on the remaining poly layer 338n in the NMOS device 306 and on the treated metal layer 316p in the PMOS device 304. The metal layer 350 may include WN or TiN having a thickness ranging from about 20 to about 100 angstrom (A). The metal layer 350 may be formed by CVD, ALCVD, bottom-up PVD, or other suitable method. A barrier metal layer 352, such as Ti, may be formed on the metal layer 350. The metal layer 352 may include a thickness ranging from about 20 to about 200 angstrom (A). The metal layer 352 may be formed by CVD, ALCVD, bottom-up PVD, or other suitable method. A filler metal layer 354, such as Al, Cu, W, or other suitable material, may be formed on the metal layer by CVD, ALCVD, bottom-up PVD, or other suitable method. The metal layer 354 may include a thickness ranging from 1000 to about 8000 angstrom (A).

Figure 2I:
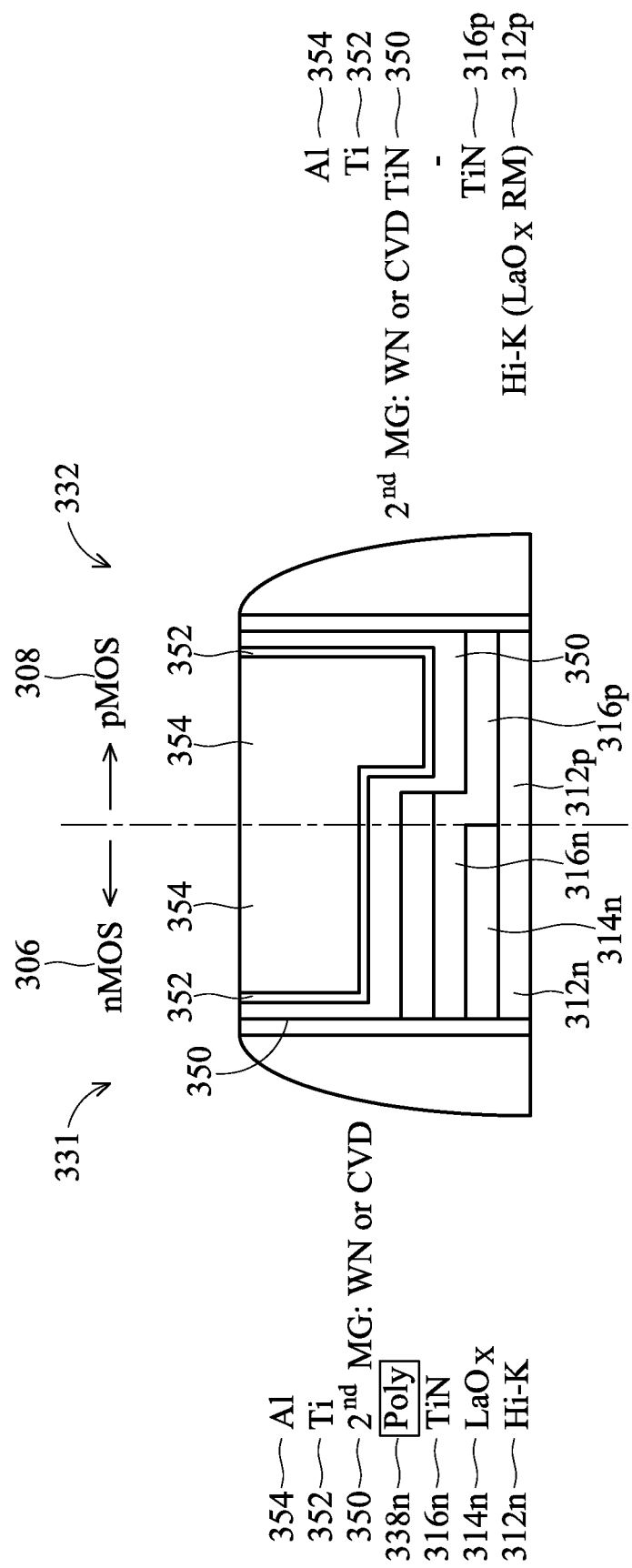

A CMP process may be performed on the metal layers 350, 352, 354 to planarize the gate structures in the NMOS device 306 and PMOS device 308. The CMP process may have a high selectivity to provide a substantially planar surface for the gate and ILD layer. The CMP process may also have low dishing and/or metal erosion effect. In FIG. 2I, illustrated is a detail cross-sectional view of the dual metal gate structure 331, 332 of the NMOS device 306 and PMOS device 308. The gate structure 331 of the NMOS device 306 may include a high-k dielectric 312n, a capping layer ($LaO_x$) 314n, a first metal layer (TiN) 316n, a poly layer 338n, a second meta layer (WN or TiN) 350, a metal barrier (Ti) 352, and a filler metal (Al) 354. The gate structure 332 of the PMOS device 308 may include a high-k dielectric 312p (capping layer $LaO_x$ removed), a first metal layer (TiN) 316p, a second meta layer (WN or TiN) 350, a metal barrier (Ti) 352, and a filler metal (Al) 354. It is understood that the semiconductor device 300 may undergo further CMOS process flow to form various features such as contacts/vias, interconnect metal layers, interlayer dielectric, passivation layers, etc.

It should be noted that the remaining portion of the poly layer 338n remains in the NMOS device 304. A pre-gate doping process (e.g., N+ doping) may be performed on the poly layer 318 in FIG. 2C so as to lower a resistance of the remaining poly layer 338n for the final gate structure of the NMOS device 306. In other embodiments, a second salicidation process may be performed to lower the resistivity of the remaining poly layer 338n after the P-metal deposition and CMP process. Alternatively, in some other embodiments, the remaining poly layer 338n may be completely removed after the treatment process 340 and prior to depositing the various P-metal layers discussed above in FIG. 2H. However, the N-metal layer 316n in the NMOS device 306 may have a greater thickness to sufficiently block the various overlying metal layers from changing its work function in the NMOS device.

Also, in another embodiment, the dummy poly layer 318n, 318p in the NMOS 306 and PMOS 308 devices, respectively, may both be completely removed from the gate stacks by a wet etch process or other suitable process. A sacrificial oxide plug may formed in the trenches (that were created by the removal of the dummy poly layer). An N/P patterning process may then be performed to protect the trench in the NMOS device 306 and expose the trench in the PMOS device 308. A dry etch process may be performed to remove the oxide plug in the PMOS device 308. The process may continue with the treatment process 340 of FIG. 2G on the N-metal layer 316p in the PMOS device 306 (PMOS Vt/Work Function Engineering). The sacrificial oxide plug in the NMOS device 306 may protect the N-metal layer 316*n* during the treatment process 340. After the treatment process, the sacrificial oxide plug may be removed and the trenches in the NMOS 306 device and PMOS device 308 may be deposited with the second metals as was discussed in FIG. 2H.

Figure 3:
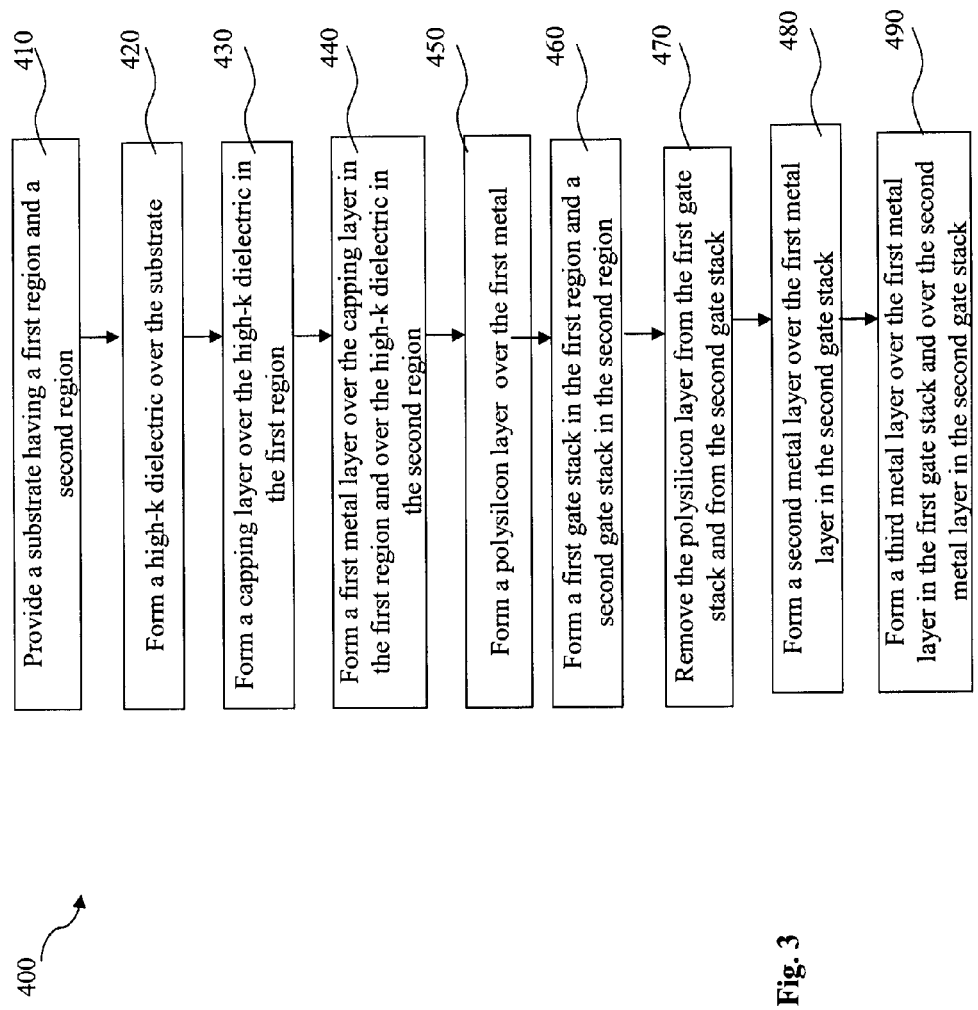
FIG. 3 is a flowchart illustrating an alternative method for fabricating a semiconductor device according to various aspects of the present disclosure.

Referring to FIG. 3, illustrated is a flowchart of another alternative method 400 for fabricating a semiconductor device having a dual gate structure for an NMOS device and a PMOS device, respectively, according to various aspects of the present disclosure. Referring also to FIGS. 4A to 4G, illustrated are cross-sectional views of a semiconductor device 500 at various stages of fabrication according to the method 400 of FIG. 3. The semiconductor device 500 is similar to the semiconductor device 300 of FIG. 2. Accordingly, similar features in FIGS. 2 and 4 are numbered the same for the sake of simplicity and clarity. Further, the method 400 is similar to the method 100 of FIG. 1 except for the differences discussed below.

Figure 4A:
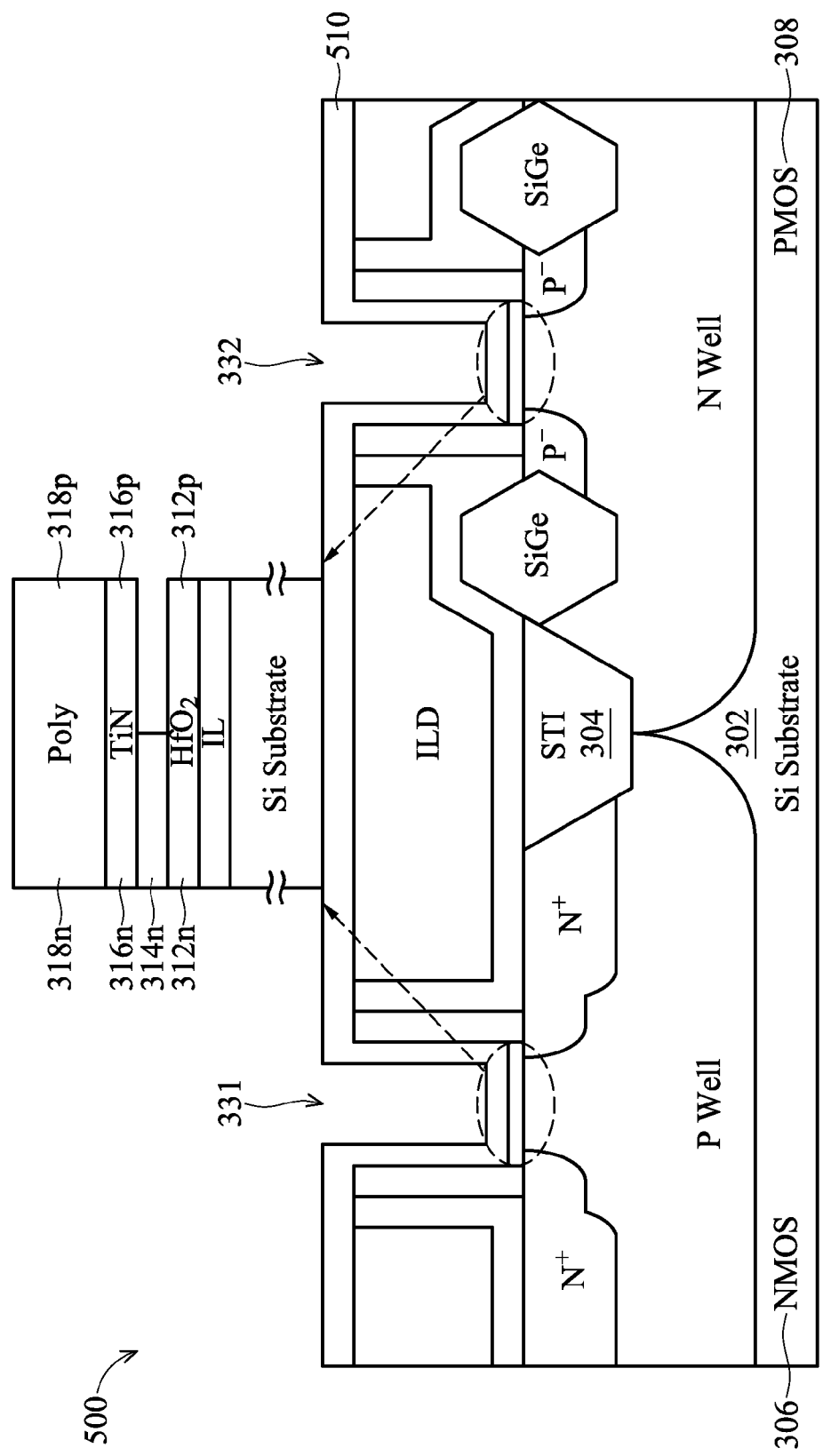
FIGS. 4A to 4G are cross-sectional views of a semiconductor device at various stages of fabrication according to the method of FIG. 3.

In FIG. 4A, the method 400 begins with block 410 in which a semiconductor substrate having a first region and a second region may be provided (similar to block 110 of FIG. 1). The method 400 continues with block 420 in which a high-k dielectric layer may be formed over the semiconductor substrate (similar to block 120 of FIG. 1). The method 400 continues with block 430 in which a capping layer may be formed over the high-k dielectric layer in the first region (similar to block 130 of FIG. 1). The method 400 continues with block 440 in which a first metal layer may be over the capping layer in the first region and over the high-k dielectric layer in the second region (similar to block 140 of FIG. 1). The first metal layer may include a thin N-metal layer such as TiN having a thickness of about 20 angstrom (A). The method 400 continues with block 450 in which a polysilicon layer may be formed over the first metal layer (similar to block 150 of FIG. 1). The method 400 continues with block 460 in which a first gate stack may be formed in the first region and a second gate stack may be formed in the second region (similar to block 160 of FIG. 1).

Figure 4B:
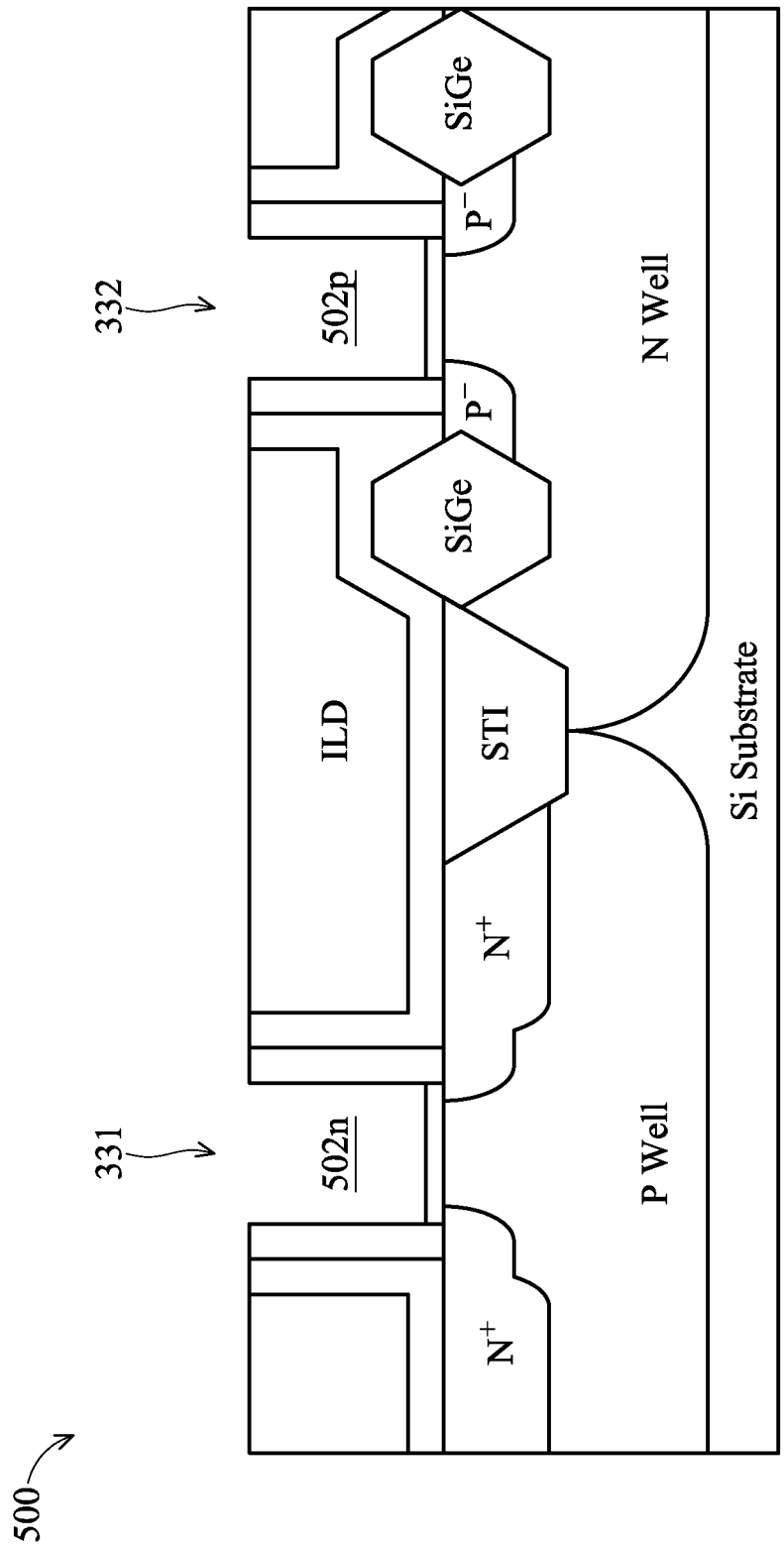
Figure 4C:
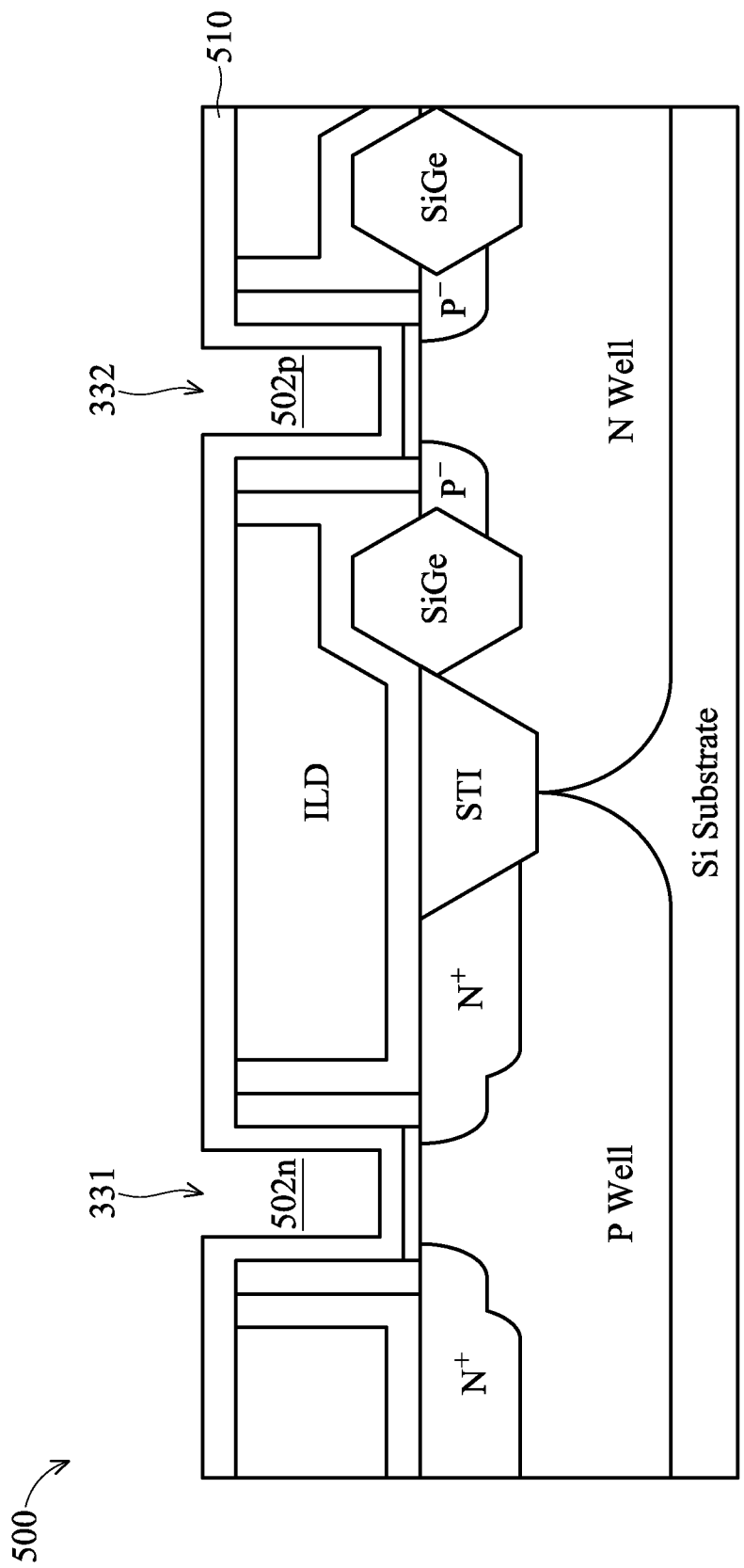
Figure 4D:
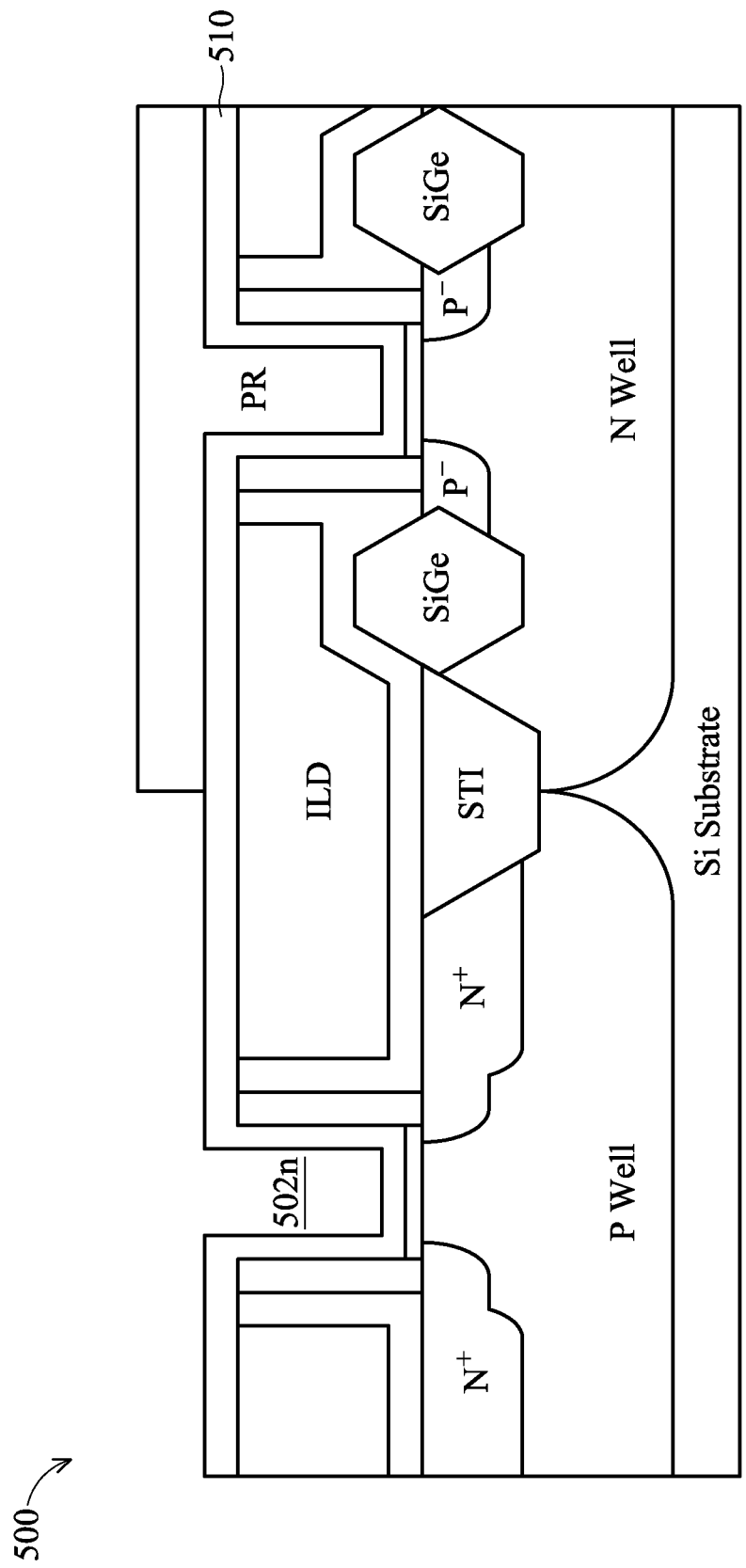
Figure 4E:
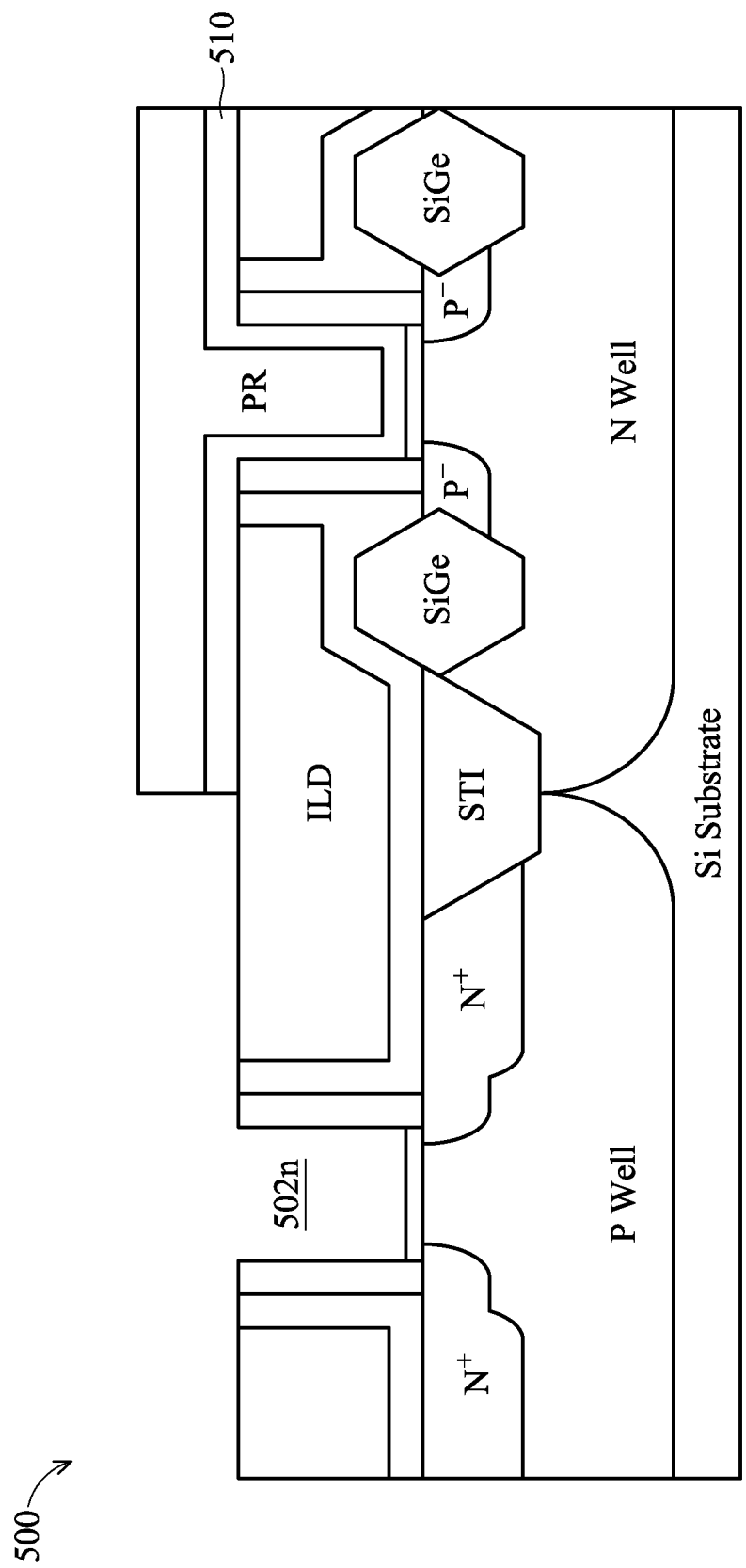

The method 400 continues with block 470 in which the poly layer may be removed from the first gate stack and from the second gate stack. In FIG. 4B, the poly layer 318*n*, 318*p* in the NMOS device 306 and PMOS device 308, respectively, may both be removed by a dry etch process, wet etch process, or combination dry and wet etch process. Accordingly, trenches 502*n*, 502*p* may be created in the gate stack 331 of the NMOS device 306 and gate stack 332 of the PMOS device 308, respectively. The method 400 continues with block 480 in which a second metal layer may be formed over the first metal in the second gate stack. In FIG. 4C, a P-type work function metal 510 may be deposited by CVD, ALCVD, bottom-up PVD, or other suitable method. The P-type metal 510 may fill in the trenches 502*n*, 502*p* in the gate stacks 331, 332, respectively. In FIGS. 4D and 4E, the P-metal 510 in the trench 502*n* of the gate stack 331 of the NMOS device 306 may be selectively etched by a dry etch process, wet etch process, or a combination dry and wet etch process. For example, a patterning process may be performed to protect the PMOS device 308 with a photoresist. The photolithography process may include spin coating, soft-baking, exposure, post-baking, developing, rinsing, drying, and other suitable process. The unprotected P-type metal 510 in the trench 502*n* may then be removed. Accordingly, the P-type metal 510 in the trench 502*p* remains unetched.

Figure 4F:
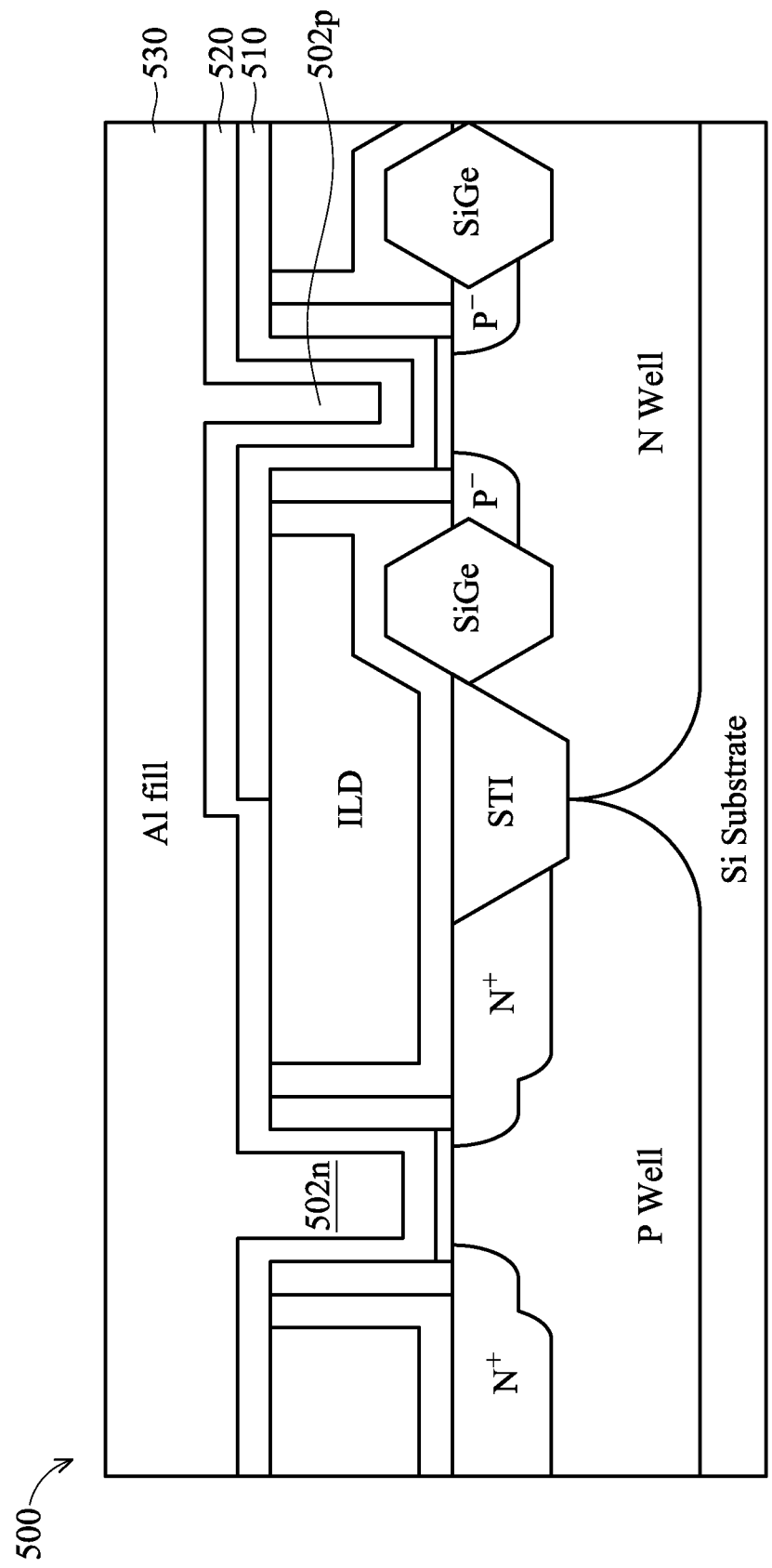
Figure 4G:
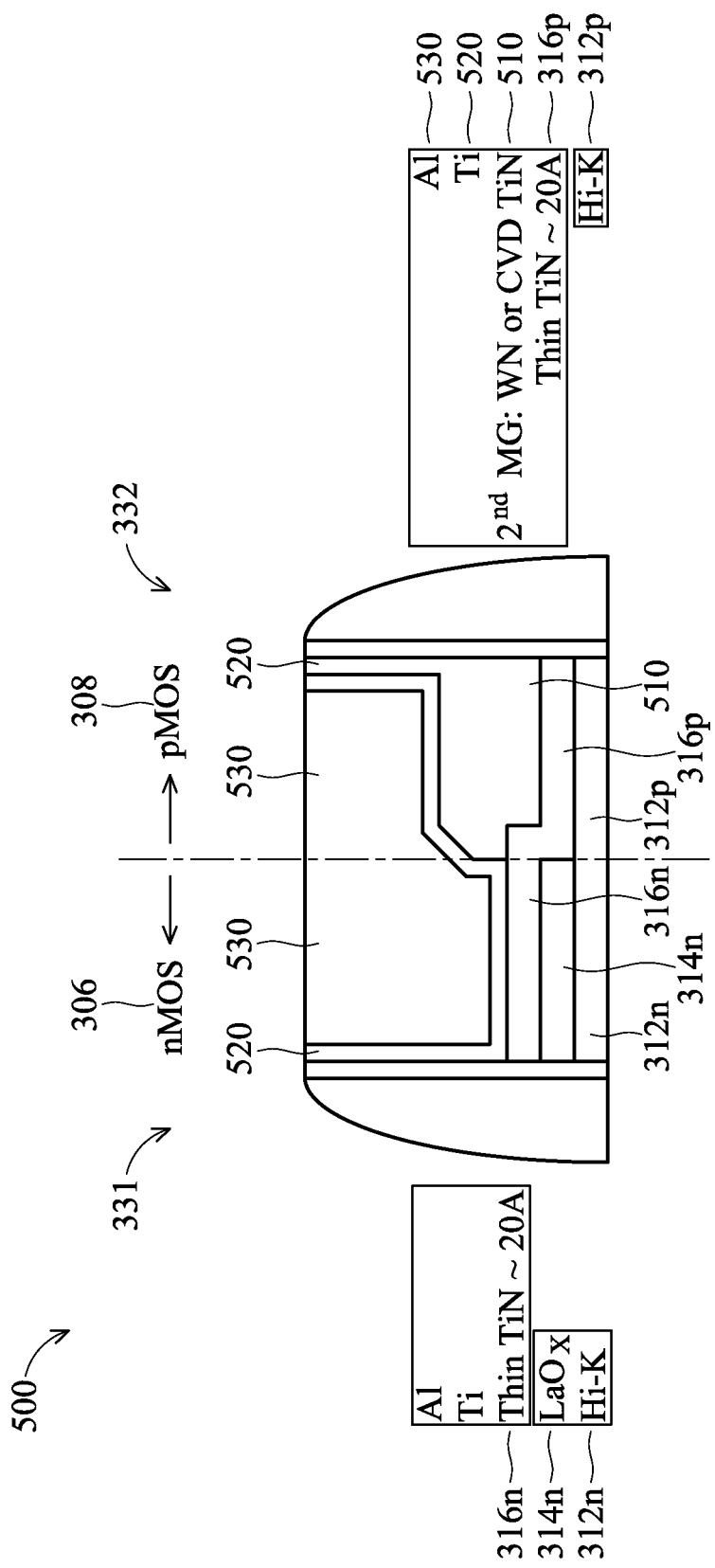

The method 400 continues with block 490 in which a third metal layer may be formed over the first metal layer in the first gate stack and over the second metal layer in the second gate stack. In some embodiments, the third metal layer may include a low work function metal. In FIG. 4F, the remaining portion of the trenches 502*n*, 502*p* of the gate stack 331 in the NMOS device 306 and gate stack in the PMOS device 308, respectively may be completed with metal. For example, a barrier metal layer 520 such as Ti may be formed over the N-metal 316*n* in the NMOS device 306 and over the P-metal 510 in the PMOS device 308. A filler metal layer 530 such as Al may then be formed over the barrier metal layer 520. The metal layers 520, 530 may be similar to the metal layers 352, 354 of FIG. 2H. A CMP process may be performed on the metal layers 520, 530 to planarize the gate structures in the NMOS device 306 and PMOS device 308. The CMP process may have a high selectivity to provide a substantially planar surface for the gate and ILD layer. The CMP process may also have low dishing and/or metal erosion effect.

In FIG. 4, illustrated is a detail cross-sectional view of the dual metal gate structure 331, 332 of the NMOS device 306 and PMOS device 308. The gate structure 331 of the NMOS device 306 may include a high-k dielectric 312*n*, a capping layer (LaO$_x$) 314*n*, a first metal layer (TiN) 316*n*, a poly layer 338*n*, a metal barrier (Ti) 520, and a filler metal (Al) 530. The gate structure 332 of the PMOS device 308 may include a high-k dielectric 312*p* (capping layer LaO$_x$ removed), a first metal layer (TiN) 316*p*, a second meta layer (WN or TiN) 510, a metal barrier (Ti) 520, and a filler metal (Al) 530. It should be noted that the thickness of the P-metal layer 510 in the PMOS device 308 may be sufficiently thick to tune the effective work function of the gate structure to perform as the PMOS device. Further, the capping layer (LaO$_x$) 314*n* in the NMOS device 306 may tune the effective work function of the gate structure to perform as the NMOS device. Moreover, the thin N-metal layer (TiN) 316*n*, 316*p* may be used to eliminate Fermi level pinning (FLP) between the poly layer 318 and high-k dielectric 312 during the gate first flow, and may be used as an etch barrier for the dummy poly removal process.

The present invention achieves different advantages in various embodiments disclosed herein. It is understood that different embodiments offer different advantages, and that no particular advantage is necessarily required for all embodiments. For example, the present disclosed method provides a simple and cost-effective method for fabricating a dual metal gate structure in a CMOS process flow. Also, the methods and devices disclosed herein may easily be integrated with current CMOS process flow and semiconductor equipment. In some embodiments, PMOS Vt/Work Function Engineering may be implemented (before gate last process) by treating the metal with an O$_2$ or plasma treatment process and can easily be integrated in a hybrid process to provide for a dual metal gate for an NMOS device and PMOS device. The dummy poly or sacrificial oxide plug may be used to protect the N-metal in the NMOS device during the treatment process. In some other embodiments, a dual high-k and dual metal gate stack for an NMOS device and PMOS device may be formed in a hybrid process with the NMOS device being formed in a gate first process and the PMOS device being formed in a gate last process. Accordingly, both NMOS and PMOS Vt/Work Function may be achieved without sacrificing either one. The NMOS Vt may be adjusted or tuned by a capping layer (second high-k) and the PMOS Vt may be adjusted or tuned by a gate last metal gate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
a first gate structure having a first conductivity type disposed over a semiconductor substrate, wherein the first gate structure includes:
a high-k dielectric layer formed over the semiconductor substrate;
a capping layer formed over the high-k dielectric layer;
a first metal layer formed over the capping layer, wherein the first metal layer has the first conductivity type; and
a fill metal layer disposed over the first metal layer; and
a second gate structure having a second conductivity type disposed over the semiconductor substrate, wherein the second conductivity type is opposite the first conductivity type, wherein the second gate structure includes:
the high-k dielectric layer formed over the semiconductor substrate;
the first metal layer formed over the high-k dielectric layer, wherein the first metal layer of the second gate structure includes a first surface facing away from the semiconductor substrate, a second surface facing away from the semiconductor substrate, and a third surface opposing the first and second surfaces and facing the semiconductor substrate, wherein the first surface is non-planar with respect to the second surface, wherein the first metal layer has a first thickness measured from the first surface to the third surface and a second thickness measured from the second surface to the third surface such that the second thickness is different than the first thickness;
a second metal layer formed over the first metal layer such that the second metal layer physically contacts the first surface and the second surface of the first metal layer of the second gate structure, wherein the second metal layer has the second conductivity type, wherein the second metal layer of the second gate structure includes a fourth surface facing away from the semiconductor substrate, a fifth surface opposing the fourth surface and facing the semiconductor substrate, a sixth surface away from the semiconductor substrate, and a seventh surface opposing the sixth surface and facing the semiconductor substrate, wherein the fourth surface is non-planar with respect to the sixth surface and wherein the fifth surface is non-planar with respect to the seventh surface, wherein the second metal layer has a third thickness measured from the fourth surface to the fifth surface and a fourth thickness measured from the sixth surface to the seventh surface such that the third thickness is different than the fourth thickness; and
the fill metal layer disposed over the second metal layer.

2. The device of claim 1, further comprising a sidewall spacer disposed along a sidewall of the second gate structure, and
wherein the second metal layer physically contacts the sidewall spacer.

3. The device of claim 2, wherein a portion of the second metal layer is positioned between the fill metal layer of the second gate structure and the sidewall spacer.

4. The device of claim 2, wherein the second gate structure further comprises a barrier layer formed over the second metal layer, and
wherein the portion of the second metal layer extends from the barrier layer to the sidewall spacer.

5. The device of claim 2, wherein the first metal layer of the second gate structure further includes an eighth surface connecting the first and second surfaces, the eighth surface facing the sidewall spacer, and
wherein the second metal of the second gate structure physically contacts the eight surface of the first metal layer of the second gate structure.

6. The device of claim 1, wherein the first metal layer of the first gate structure physically contacts the first metal layer of the second gate structure.

7. The device of claim 1, wherein the fill metal layer of the second gate structure has a top surface facing away from the substrate that is substantially coplanar with a top surface of second metal layer facing way from the substrate.

8. A device comprising:
a first gate structure having a first conductivity type disposed over a semiconductor substrate, wherein the first gate structure includes:
a high-k dielectric layer formed over the semiconductor substrate;
a capping layer formed over the high-k dielectric layer;
a first metal layer formed over the capping layer, wherein the first metal layer has the first conductivity type; and
a fill metal layer disposed over the first metal layer; and
a second gate structure having a second conductivity type disposed over the semiconductor substrate, wherein the second conductivity type is opposite the first conductivity type, wherein the second gate structure includes:
the high-k dielectric layer formed over the semiconductor substrate;
the first metal layer formed over the high-k dielectric layer, wherein the first metal layer of the second gate structure includes a first portion having a first thickness and a second portion having a second thickness, wherein the first thickness is different than the second thickness;
a second metal layer formed over the first metal layer, wherein the second metal layer has a third thickness over the first portion of the first metal layer and a fourth thickness over the second portion of the first metal layer, wherein the third thickness is greater than the fourth thickness; and
the fill metal layer disposed over the second metal layer.

9. The device of claim 8, wherein the first thickness is greater than the second thickness, and
wherein the third thickness is less than the fourth thickness.

10. The device of claim 8, wherein a top surface of the fill metal layer of the second gate structure is substantially coplanar with a top surface of the second metal layer.

11. The device of claim 8, wherein the second gate structure is without the capping layer.

12. The device of claim 8, wherein the first gate structure is without the second metal layer.

13. The device of claim 8, wherein the first portion of the first metal layer includes a tapered top surface with respect to a top surface of the semiconductor substrate.

14. The device of claim 8, wherein the first conductivity type is a p-type conductivity and wherein the second conductivity type is an n-type conductivity.

15. A semiconductor device, comprising:
a semiconductor substrate;

a first transistor formed in the semiconductor substrate, the first transistor having a gate structure that includes:
a high-k dielectric formed over the substrate;
a capping layer formed over the high-k dielectric;
an untreated first metal layer formed over the capping layer; and
a second metal layer formed over the untreated first metal layer;

a second transistor formed in the semiconductor substrate, the second transistor having a gate structure that includes:
the high-k dielectric formed over the substrate;
a treated first metal layer formed directly on the high-k dielectric such that the treated first metal layer physically contacts the high-k dielectric, wherein the treated first metal layer includes a first surface facing away from the semiconductor substrate, a second surface facing away from the semiconductor substrate, and a third surface opposing the first and second surfaces and facing the semiconductor substrate, wherein the first surface is non-planar with respect to the second surface, wherein the treated first metal layer has a first thickness measured from the first surface to the third surface and a second thickness measured from the second surface to the third surface such that the second thickness is different than the first thickness; and
the second metal layer formed over the treated first metal layer.

16. The semiconductor device of claim 15, wherein the first transistor is an NMOS device and wherein the second transistor is a PMOS device.

17. The semiconductor device of claim 15, wherein the first transistor further includes a doped polysilicon layer formed between the untreated first metal layer and the second metal layer.

18. The semiconductor device of claim 15, wherein the second metal layer includes a P-type work function metal.

19. The semiconductor device of claim 15, wherein the capping layer includes $LaO_x$.

20. The semiconductor device of claim 15, wherein the untreated first metal layer includes an N-type work function metal, and wherein the treated first metal layer includes one of an $O_2$ annealed N-type work function metal and a plasma treated N-type work function metal.

\* \* \* \* \*